(12) United States Patent
Chern

(10) Patent No.: US 7,008,846 B2
(45) Date of Patent: Mar. 7, 2006

(54) NON-VOLATILE FLOATING GATE MEMORY CELL WITH FLOATING GATES FORMED AS SPACERS, AND AN ARRAY THEREOF, AND A METHOD OF MANUFACTURING

(75) Inventor: Geeng-Chuan Chern, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 332 days.

(21) Appl. No.: 10/422,183

(22) Filed: Apr. 23, 2003

(65) Prior Publication Data

US 2004/0214393 A1 Oct. 28, 2004

(51) Int. Cl.
*H01L 21/336* (2006.01)
*H01L 29/76* (2006.01)
*H01L 29/788* (2006.01)

(52) U.S. Cl. ............... 438/264; 438/257; 257/314; 257/315

(58) Field of Classification Search .......... 438/197, 438/257, 264, 267; 257/288, 314, 315
See application file for complete search history.

(56) References Cited

U.S. PATENT DOCUMENTS

| | | | |
|---|---|---|---|
| 5,021,999 A | 6/1991 | Kohda et al. | |
| 5,029,130 A | 7/1991 | Yeh | |
| 5,768,192 A | 6/1998 | Eitan | |
| 6,002,152 A | 12/1999 | Guterman et al. | |
| 6,011,725 A | 1/2000 | Eitan | |
| 6,074,914 A | * 6/2000 | Ogura | 438/257 |

(Continued)

OTHER PUBLICATIONS

IEEE, 2002, entitled "Quantum-well Memory Device (QW/MD) With Extremely Good Charge Retention," Z. Krivokapic, et al. (4 pages).

Hayashi et al., "A Self-Aligned Split-Gate Flash EEPROM Cell With 3-D Pillar Structure," pp. 87-88, 1999 Symposium on VLSI Technology Digest Of Technical Papers, Center for Integrated Systems, Stanford University, Stanford, CA 94305, USA.

*Primary Examiner*—Michael Lebentritt
*Assistant Examiner*—Scott B. Geyer
(74) *Attorney, Agent, or Firm*—Ronald L. Yin; DLA Piper Rudnick Gray Cary US LLP

(57) ABSTRACT

A non-volatile memory cell has a single crystalline semiconductive material, such as single crystalline silicon, of a first conductivity type. A first and a second region each of a second conductivity type, different from the first conductivity type, spaced apart from one another is formed in the semiconductive material. A channel region, having a first portion, a second portion and a third portion connects the first and second regions for the conduction of charges. The first portion is adjacent to the first region, the third portion is adjacent to the second region, and the second portion is between the first portion and the third portion. A first dielectric is on the channel region. A second dielectric is on the first region. A third dielectric is on the second region. A first floating gate, formed as a spacer, is immediately adjacent to and contiguous with the second dielectric and is adjacent to the first dielectric and is spaced apart from the first portion of the channel region. A second floating gate, formed as a spacer, is immediately adjacent to and contiguous with the third dielectric and is adjacent to the first dielectric and is spaced apart from the third portion of the channel region. A gate electrode is capacitively coupled to the first and second floating gates and is spaced apart from the second portion of the second portion.

37 Claims, 13 Drawing Sheets

U.S. PATENT DOCUMENTS

| | | |
|---|---|---|
| 6,093,945 A | 7/2000 | Yang |
| 6,103,573 A | 8/2000 | Harari et al. |
| 6,151,248 A | 11/2000 | Harari et al. |
| 6,197,637 B1 * | 3/2001 | Hsu et al. .................. 438/257 |
| 6,281,545 B1 | 8/2001 | Liang et al. |
| 6,329,685 B1 | 12/2001 | Lee |
| 6,420,231 B1 | 7/2002 | Harari et al. |
| 6,426,896 B1 | 7/2002 | Chen |
| 6,597,036 B1 | 7/2003 | Lee et al. |
| 6,746,920 B1 * | 6/2004 | Wen et al. .................. 438/257 |
| 2002/0056870 A1 | 5/2002 | Lee et al. |
| 2002/0163031 A1 | 11/2002 | Liv et al. |
| 2004/0087084 A1 | 5/2004 | Hsieh |

* cited by examiner

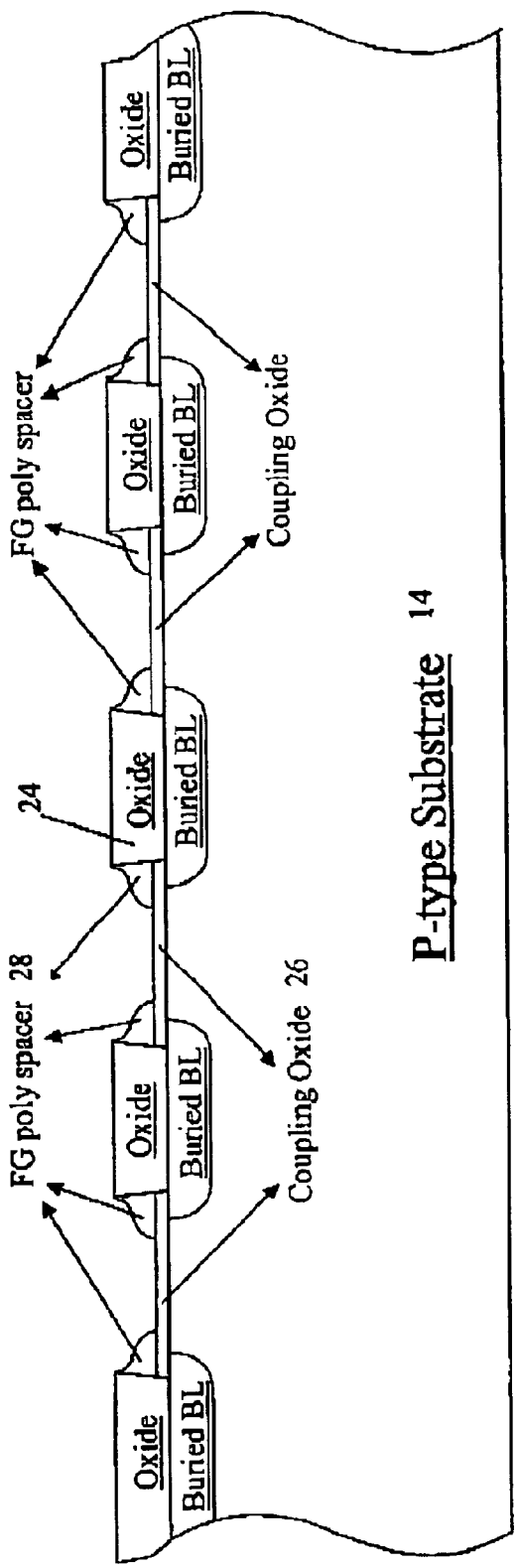
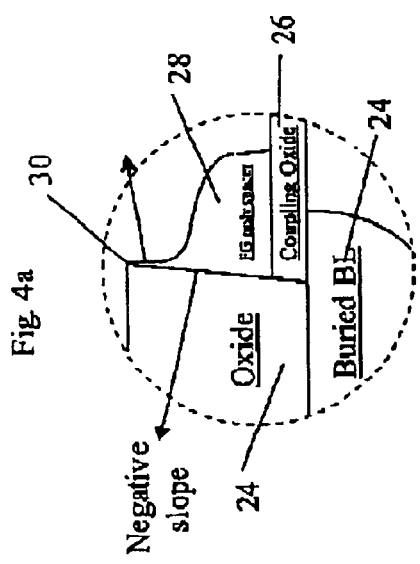

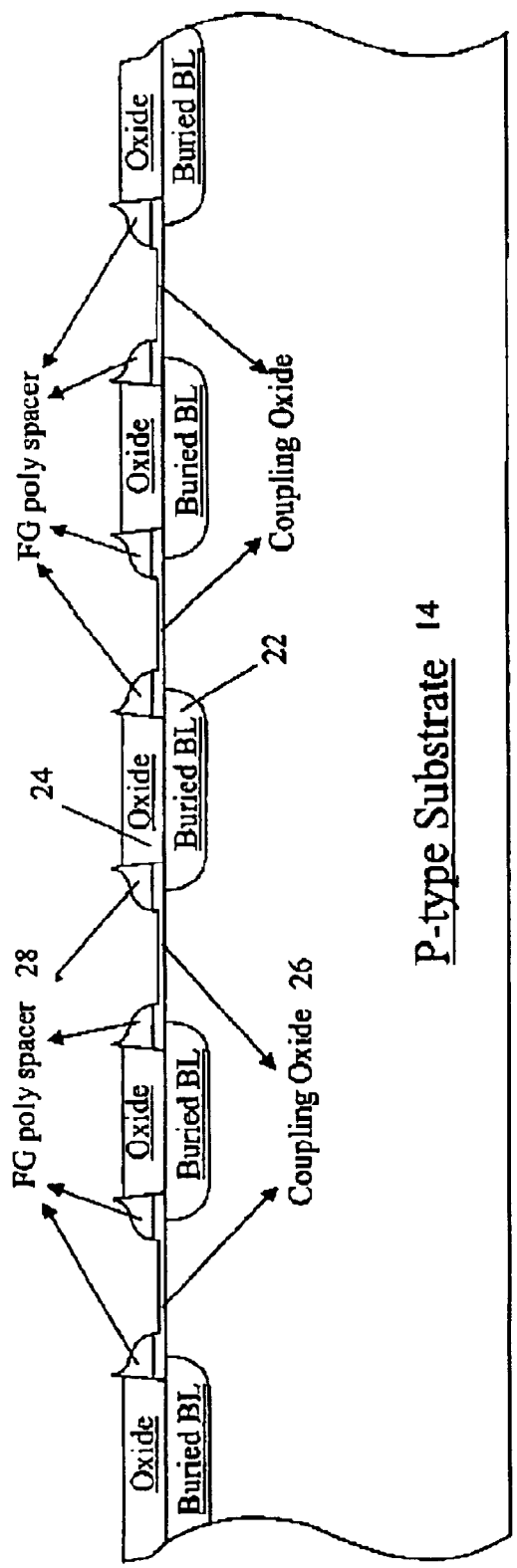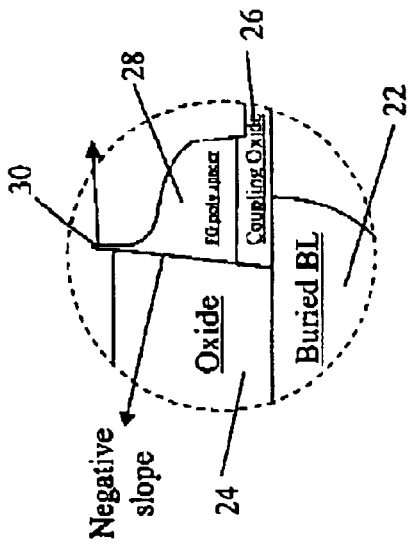
Fig. 5a
Fig. 5b

US 7,008,846 B2

NON-VOLATILE FLOATING GATE MEMORY CELL WITH FLOATING GATES FORMED AS SPACERS, AND AN ARRAY THEREOF, AND A METHOD OF MANUFACTURING

TECHNICAL FIELD

The present invention relates to a non-volatile memory cell, that has two floating gates for storing a plurality of bits, and which is capable of bi-directionally storing and reading the plurality of bits, with each of the floating gates formed as a spacer adjacent to a dielectric. The present invention also relates to an array of such cells and a method of manufacturing the cell and the array.

BACKGROUND OF THE INVENTION

Uni-directional read/program non-volatile memory cells using floating gate for storage are well known in the art. See for example, U.S. Pat. No. 5,029,130. Typically, each of these types of memory cells uses a conductive floating gate to store one bit, i.e. either the floating gate stores charges or it does not. The charges stored on a floating gate control the conduction of charges in a channel of a transistor. In a desire to increase the storage capacity of such non-volatile memory cells, the floating gate of such memory cell is programmed to store some charges, with the different amount of charges stored being determinative of the different states of the cell, thereby causing a plurality of bits to be stored in a single cell. The problem with programming a cell to one of a multilevel state and then reading such a state is that the amount of charge stored on the floating gate differentiating one state from another must be very carefully controlled.

Bi-directional read/program non-volatile memory cells capable of storing a plurality of bits in a single cell are also well known in the art. See, for example, U.S. Pat. No. 6,011,725. Typically, these types of memory cells use an insulating trapping material, such as silicon nitride, which is between two other insulation layers, such as silicon dioxide, to trap charges. The charges are trapped near the source/drain also to control the conduction of charges in a channel of a transistor. The cell is read in one direction to determine the state of charges trapped near one of the source/drain regions, and is read in the opposite direction to determine the state of charges trapped near the other source/drain region. Hence, these cells are read and programmed bi-directionally. The problem with these types of cells is that to erase, holes or charges of the opposite conductivity must also be "programmed" or injected into the trapping material at precisely the same location where the programming charges were initially trapped in order to "neutralize" the programming charges. Since the programming charges and the erase charges are injected into a non-conductive trapping material, the charges do not move as in a conductive material. Therefore, if there is any error in injecting the erase charges to the location of the programming charges, the erase charges will not neutralize the programming charges, and the cell will not be completely erased. Another problem is that the insulating trapping material, such as silicon nitride, is usually not a very good insulator, which is electrically leaky. Therefore, if one side of the cell is programmed and the other erased, the programmed charges will eventually leak to the erased side, causing data retention problem. Moreover, to inject the erase charges, the cell must be erased bi-directionally, thereby increasing the time required for erasure of one cell.

Hence there is a need for a non-volatile memory cell and array that overcomes these problems.

SUMMARY OF THE INVENTION

In the present invention, a non-volatile memory cell comprises a substantially single crystalline semiconductive material, such as single crystalline silicon, of a first conductivity type. A first and a second region each of a second conductivity type, different from the first conductivity type, spaced apart from one another is formed in the semiconductive material. A channel region, having a first portion, a second portion, and a third portion connects the first and second regions for the conduction of charges, with the first portion adjacent to the first region, the third portion adjacent to the second region, and the second portion between the first and third portions. A first dielectric is on the channel region. A second dielectric is on the first region with a third dielectric on the second region. A first floating gate, formed as a spacer, is immediately adjacent to the second dielectric and is spaced apart from the first portion of the channel region. A second floating gate, formed as a spacer, is immediately adjacent to the third dielectric and is spaced apart from the third portion of the channel region. A gate electrode is capacitively coupled to the first floating gate and second floating gate, and is spaced apart from the second portion of the channel region.

The present invention also relates to an array of the foregoing described memory cells, and a method of making the non-volatile memory cell and the array.

BRIEF DESCRIPTION OF THE DRAWINGS

FIG. 4a is a cross sectional view of the same structure shown in FIG. 3, showing the next step in the method of the present invention.

FIG. 4b is an enlarged view of a portion of the structure shown in FIG. 4a.

FIG. 5a is a cross sectional view of the same structure shown in FIG. 4a, showing the next step in the method of the present invention.

FIG. 5b is an enlarged view of a portion of the structure shown in FIG. 5a.

DETAILED DESCRIPTION OF THE INVENTION

Figure 6:
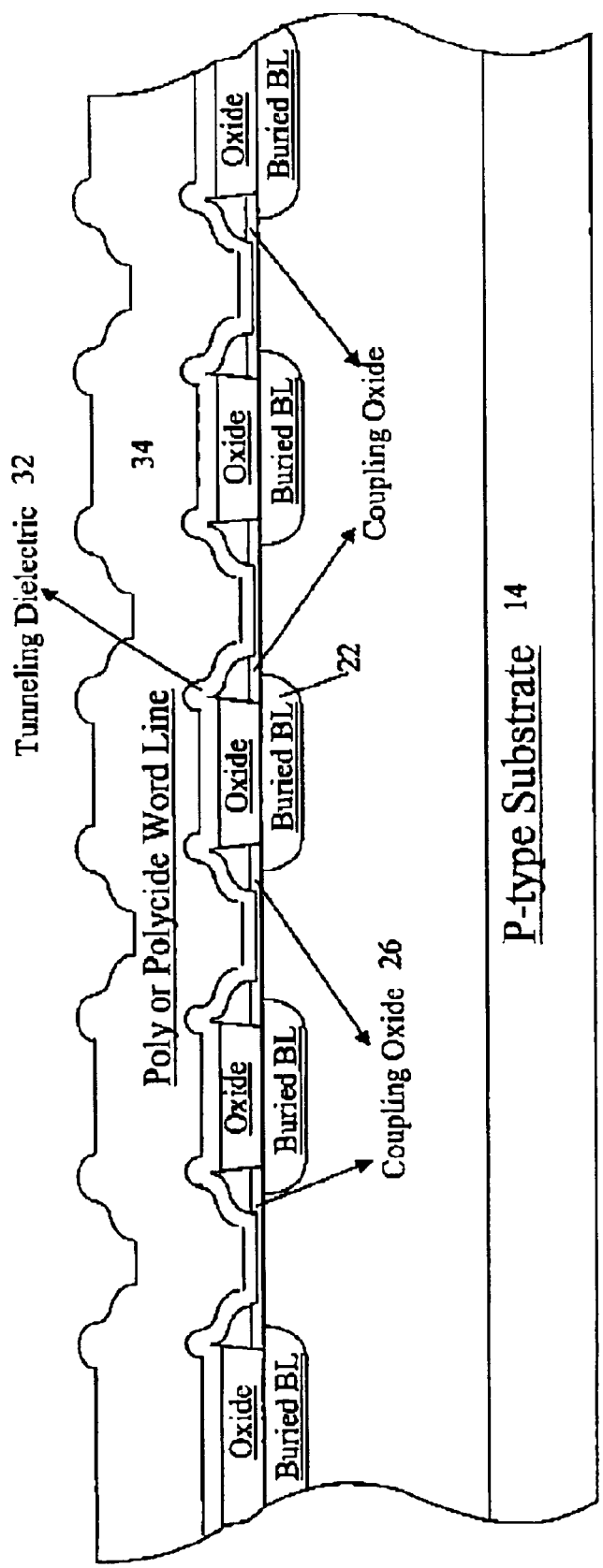
FIG. 6 is a cross sectional view of the same structure shown in FIG. 5a, showing the next step in the method of the present invention.
Figure 7:
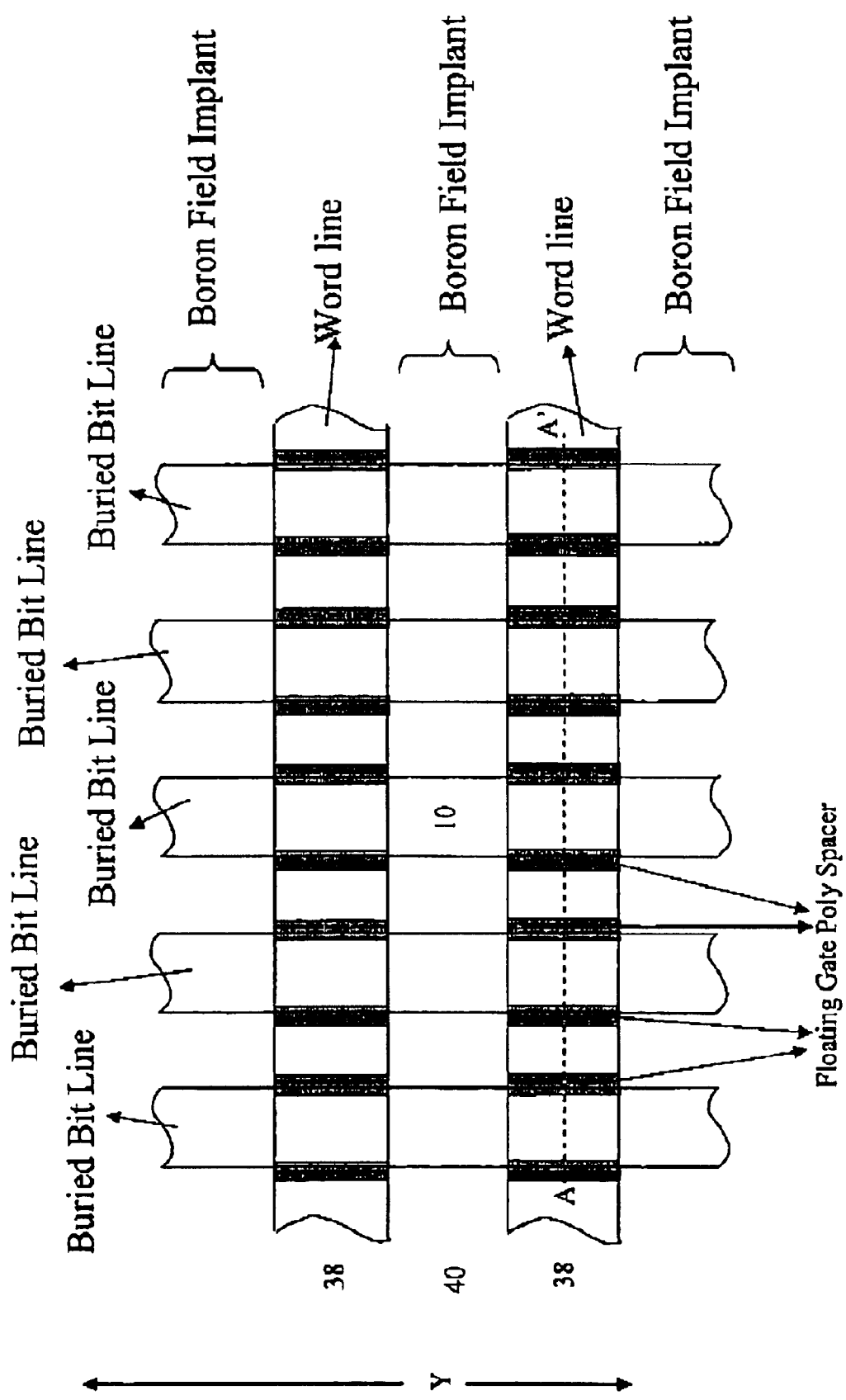
FIG. 7 is a top view of the structure shown in FIG. 6, after the next step in the method of the present invention.

The present invention is illustrated in FIGS. 1 to 7, which show the processing steps of one method in making the memory cell array 10 of the present invention. A top view of the manufactured memory cell array 10 is shown in FIG. 7. FIGS. 1–3, 4*a*, 5*a*, and 6 are cross sectional views of the memory cell array 10 shown in FIG. 7, taken along the lines A—A. What is described herein is for one process. However, it will be understood by those skilled in the art that the present invention is not limited to any specific process technology generation, nor to any specific value in any of the process parameters described hereinafter.

Figure 1:
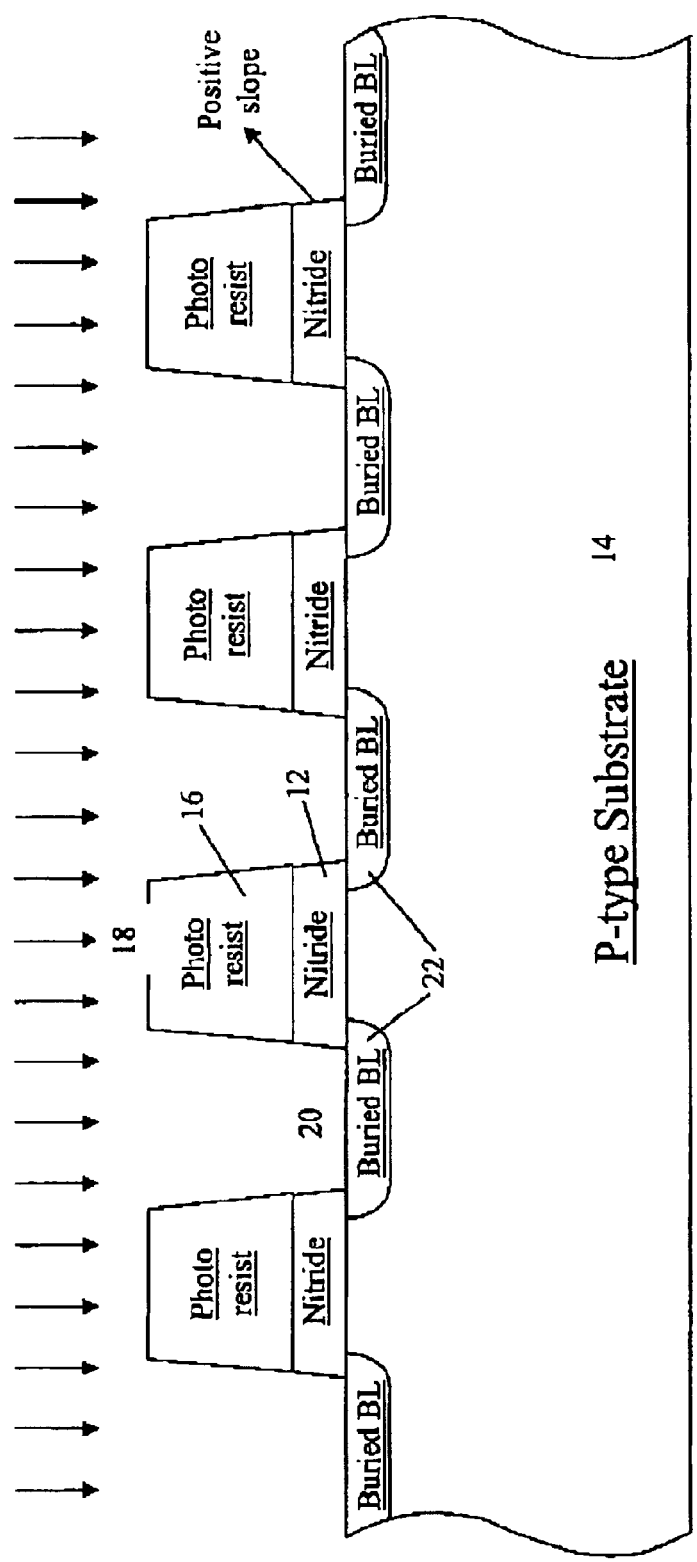
FIGS. 1–3 are cross-sectional views of a semiconductive substrate, such as single crystalline silicon, showing a series of steps in one method of manufacturing the memory cell and array of the present invention.

Referring to FIG. 1 there is shown a cross sectional view of the first steps in one method of the present invention in manufacturing the memory cell array 10. Initially a layer of silicon nitride ("nitride") 12 of approximately 50–300 nm is deposited on a single crystalline substrate 14 such as single crystalline silicon. Preferably the silicon substrate 14 is of P conductivity type. If the P conductivity type concentration is not high enough, optional multiple Boron with different energies can be implanted in the memory array area. This optional Boron implant step allows one to optimize the P-type concentrations in the memory array area and the periphery control circuit area separately. Photoresist 16 is then deposited on the layer of nitride 12. The photoresist 16 is masked and patterned to form a plurality of strips 18, which are spaced apart and parallel to one another. The portions of nitride 12 that are not covered by strips 18 are etched using a dry etching method until the substrate 14 is reached. Due to the nature of dry etching, the side walls of the nitride 12 usually form a vertical or a positive slope which is preferred. By a "positive slope" it is meant that the sidewalls of the remaining nitride 12 slope inward towards one another. Between each adjacent strip 18 of photoresist 16 and nitride 12 is a gap 20.

Arsenic and/or Phosphorous is then implanted into the structure shown in FIG. 1. Where the strips 18 cover the substrate 14, the implant is unable to penetrate into the substrate 14. However, in the gaps 20, the implant forms a plurality of buried lines 22 each of which extends in a column direction Y. Each memory cell of the present invention is defined by a pair of buried lines 22. Thus, memory cells in the same column line share the same buried lines 22, and memory cells in adjacent columns share a common buried line 22. The photoresist 16 is then removed. Of course, the implanting step can also occur after the photoresist 16 is removed.

Figure 2:
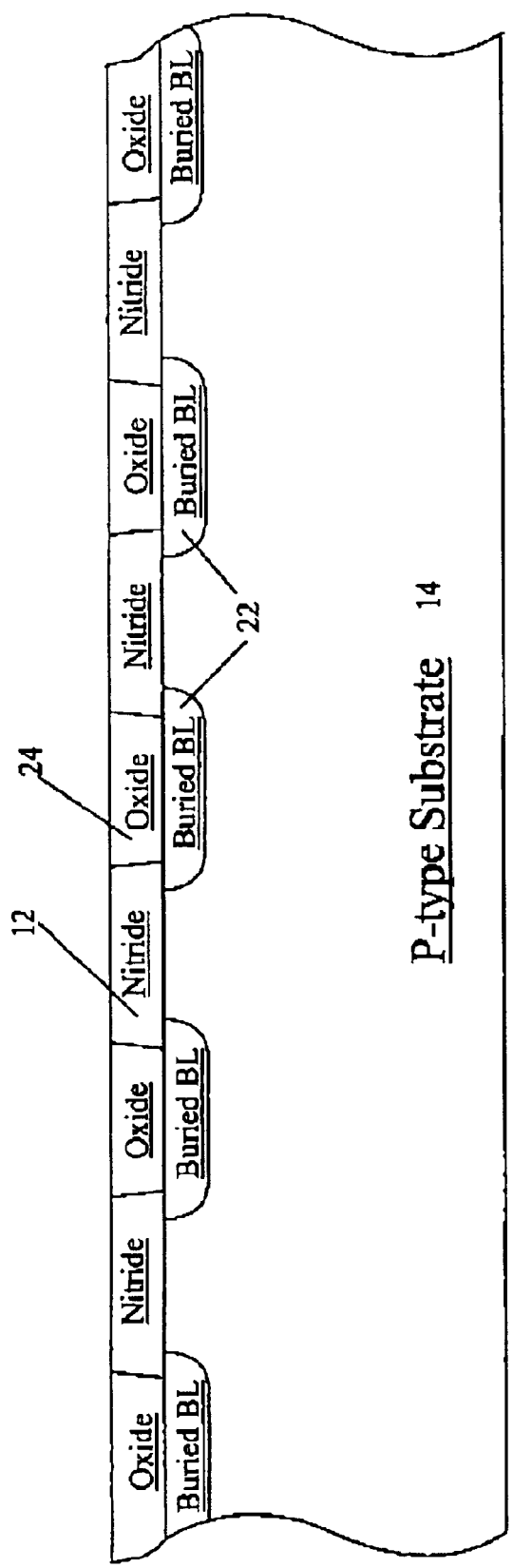

Silicon dioxide ("oxide") 24 is then deposited on the structure shown in FIG. 1 (after the photoresist 16 is removed). The oxide 24 fills the gaps 20 and is also deposited on the nitride 12. The oxide 24 is thick enough so that it fills the gap between adjacent nitride 12 regions. As a result, the oxide 24 is immediately adjacent to the buried lines 22 and also extend in the column direction Y. The oxide 24 on the nitride 12 is removed by CMP process. The resultant structure is shown in FIG. 2. Because each oxide 24 is immediately adjacent to a nitride 12, which has a sidewall with a vertical or positive slope, the sidewall of the oxide 24 will have a vertical or negative slope.

Figure 3:
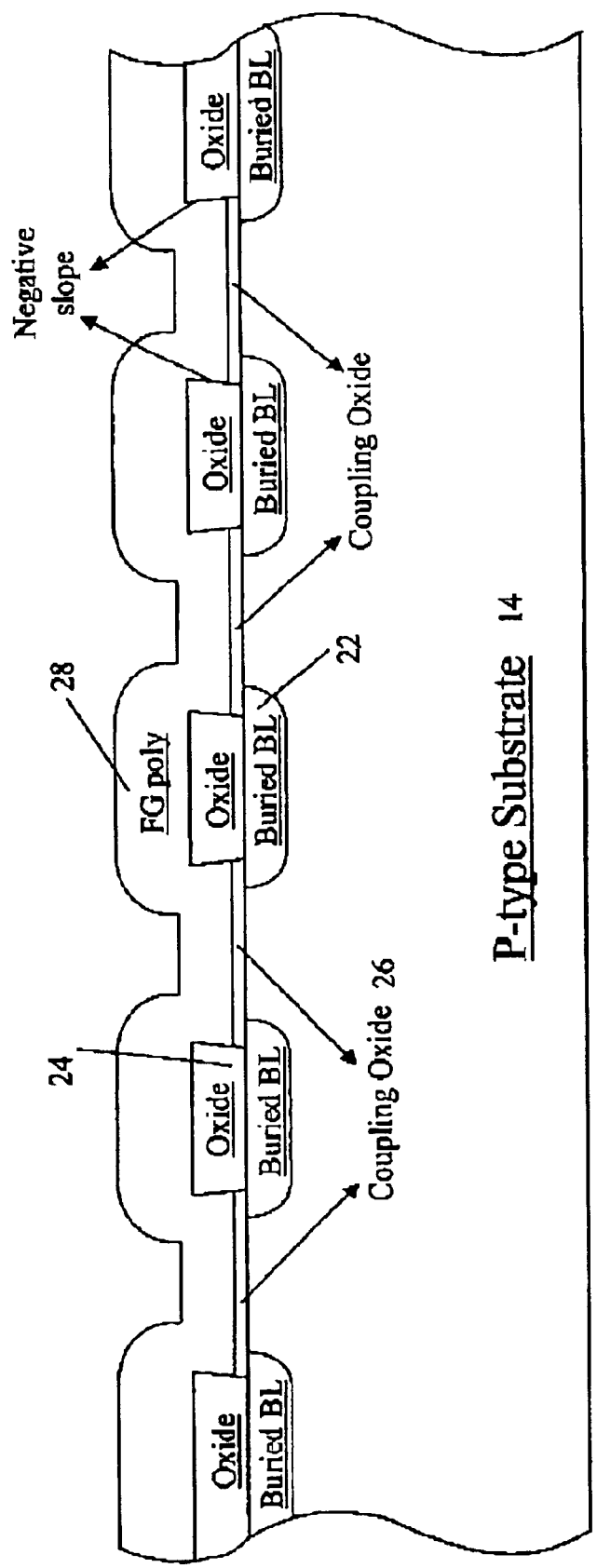

The structure shown in FIG. 2 is then subject to a nitride 12 removal step. Preferably this is done by wet etch, because the oxide 24 has sidewalls with a vertical or negative slope. A thin layer (on the order of 6–15 nm) of oxide 26 is then deposited or thermally grown. The oxide 26 will form the coupling oxide for the memory cell to be formed. A layer of polysilicon 28 (on the order of 20–100 nm) is deposited over the entire structure. The polysilicon can be doped in-situ or it can be formed undoped with an implant step thereafter to dope it. The resultant structure is shown in FIG. 3.

The polysilicon 28 is subject to an anisotropic etch until the oxide region 24 is reached. The result is the formation of a pair of strips of polysilicon spacers 28 immediately adjacent to and contiguous with each oxide strip 24. However, the strips of polysiclion spacers 28 associated with each oxide strip 24 are not connected to the strips of polysilicon spacers 28 of an immediately adjacent oxide strip 24. Thus each pair of strips of polysilicon spacers 28 is separated by either a gap or by an oxide strip 24. Each strip of polysilicon spacer 28 is also "on" the coupling oxide 26 and is spaced apart from the substrate 14. Because each strip of polysilicon spacer 28 is immediately adjacent to an oxide strip 24 that has a sidewall with a vertical or negative slope, each strip of polysilicon spacer 28 will have a sharp edge 30 projecting upwardly, i.e. in a direction somewhat perpendicular to the top planar surface of the substrate 14. The resultant structure is shown in FIG. 4*a*. FIG. 4*b* is an enlarged view of the polysilicon spacer 28, and its relationship to the adjacent oxide 24, the coupling oxide 26, and the buried line 22.

The structure shown in FIG. 4*a* is then subject to a light oxide etch, removing no more than approximately 3–20 nm from the top surface of the oxide strip 24 and from the top surface of the coupling oxide 26. This step causes the "sharp edge" 30 to be exposed. This step, however, is optional. It has two purposes. One is to partially or fully remove the exposed coupling oxide 26, which may have been damaged during anisotropic poly etch. The other is to expose the sharp edge 30 more so that both two sides of the sharp edge have only thin tunneling oxide 32 (shown in FIG. 6) in between Floating Gate spacer 28 and Word Line 34 (shown in FIG. 6), which enhances the tunneling efficiency. If this step is skipped, one side of the sharp edge 30 may have relatively thick oxide 24 and tunneling oxide 32 in between Floating Gate spacer 28 and Word Line 34, which results in a lower tunneling efficiency. The resultant structure is shown in FIG. 5*a*. An enlarged view of the polysilicon spacer 28, with its sharp edge 30, and its relationship to the adjacent oxide 24, the coupling oxide 26, and the buried line 22 is shown in FIG. 5*b*.

The structure shown in 5*a* and 5*b* is then subjected to a process step that forms a layer of tunneling dielectric layer 32 on the structure. The tunneling dielectric layer 32 can be a layer of HTO (Hot Thermal Oxide) or it can be thermal oxide or a cornbinalion thereof. The layer 32 can be on the order of 8–20 nm in thickness. Thereafter, a layer 34 of polysilicon or polysilicide is deposited on the tunneling dielectric layer 32. Again, the layer 34 of polysilicon can be doped in-situ or it can be formed undoped with an implant step thereafter to dope it.

Photoresist 17 is then applied to the structure shown in FIG. 6. A masking step is formed in which strips of photoresist are removed in a direction parallel to the A—A direction, shown in FIG. 1–6. The masking step covers strips 38, extending in a row direction, and leaves strips of gaps 40 between adjacent strips 38. The material in the strips 40 between adjacent strips 38, (consisting of polysilicon 34, tunneling dielectric 32, and floating gate strip 28) are removed by anisotropic etching. This "cuts" the polysilicon floating gate spacer 28 so that it is no longer continuous in the column direction. Thus, the only structure continuous in the column direction Y are the buried lines 22, and the oxide strips 24 formed thereon. Finally, to further isolate memory cells in one row from an adjacent spaced apart row, optional Boron is implanted into the structure with the mask layer covering the strips 38, and exposing the strips 40. The Boron implant serves to isolate the channel region of cells in one row from the channel region of cells in an adjacent, spaced apart row. A top view of the resultant structure is shown in FIG. 7.

Figure 8:
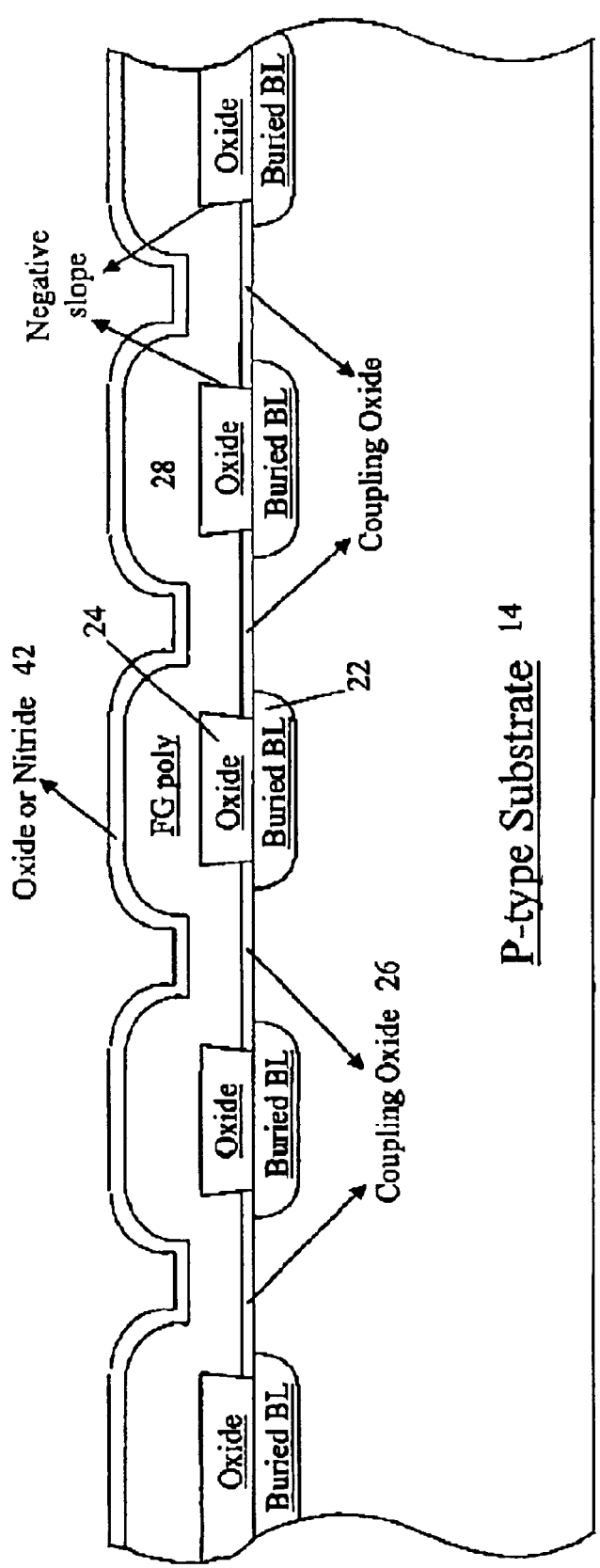
FIGS. 8–11 are cross section views showing a series of steps in a variation of the method of manufacturing the memory cell and array of the present invention, shown in FIGS. 1–7.

An alternative method for making the memory cell and array of the present invention begins with the same steps shown and described for FIGS. 1–3. Thereafter, however, a thin layer 42 of either nitride or oxide (on the order of 5–45 nm) is deposited on the polysilicon 28. The resultant structure is shown in FIG. 8.

The layer 42 of oxide or nitride is anisotropically etched, until it forms spacers 42 about the polysilicon layer 28. The resultant structure is shown in FIG. 9.

Figure 9:
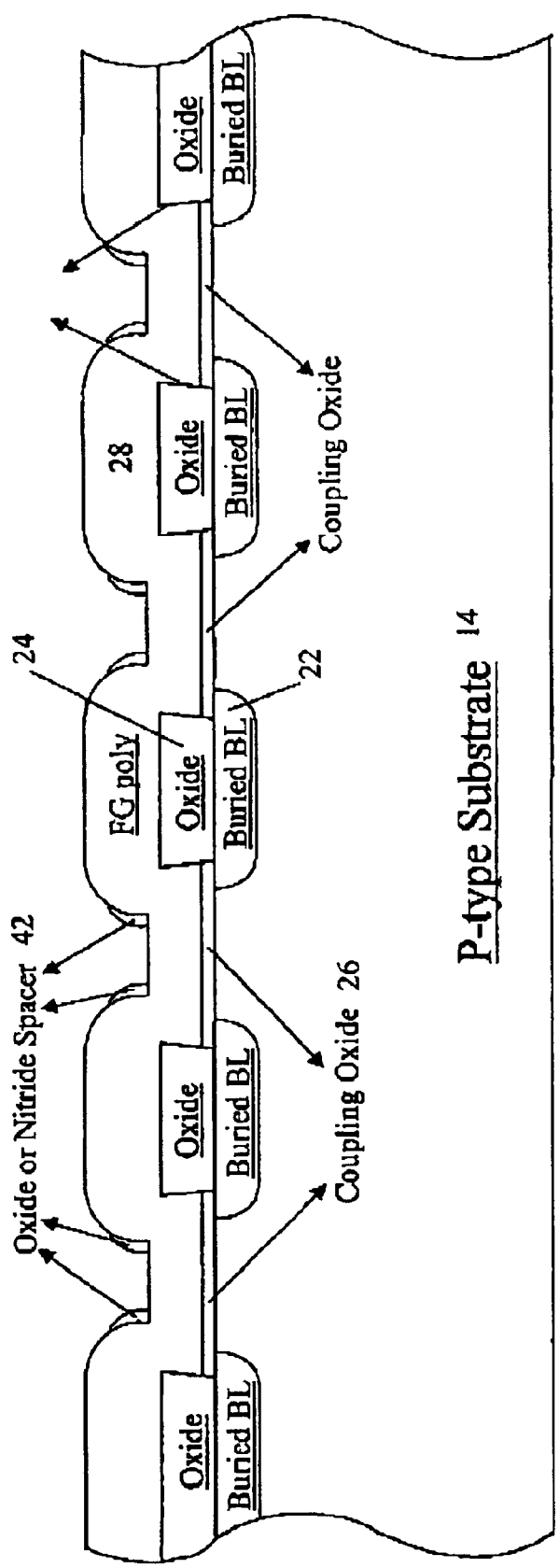

An anisotropic etch of the polysilicon layer 28 is then performed on the structure shown in FIG. 9 until the oxide region 24 is reached. As a result, the polysilicon 28 will be etched to form strips of spacers adjacent to the oxide strips 24 such as that shown and described for FIG. 4a. However, unlike the strips of polysilicon spacers 28 shown and described in FIG. 4a, the polysilicon spacers 28 shown in FIG. 10 have two parts: a first spacer 27 that is immediately adjacent to the oxide strip 24, and a second spacer 29 connected to the first spacer 27, but having a dip 44 therebetween. The spacer 28 has two edges 30 and 31. The edge 30 is in the same location as the edge 30 shown and described in FIG. 4a. The edge 31 is an edge on the second spacer 29. The resultant structure is shown in FIG. 10.

Figure 10:
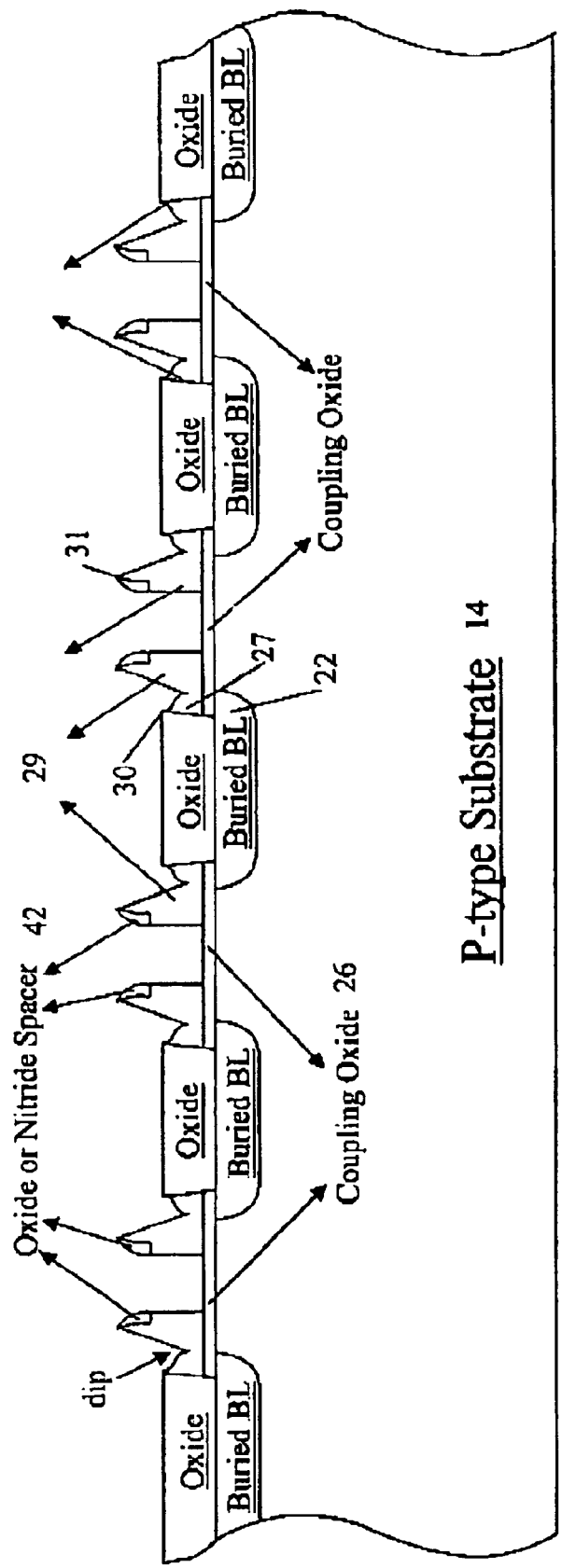

A layer of oxide 46, but preferably nitride 46 (on the order of 5–20 em) is deposited on the structure shown in FIG. 10. The nitride is then subjected to an anisotropic etch, leaving nitride spacers adjacent to the polysilicon spacer 28 (adjacent to the second spacer 29), and filling in the dip 44 between the first spacer 27 and second spacer 29. The reaultant structure is shown in FIG. 11.

Figure 11:
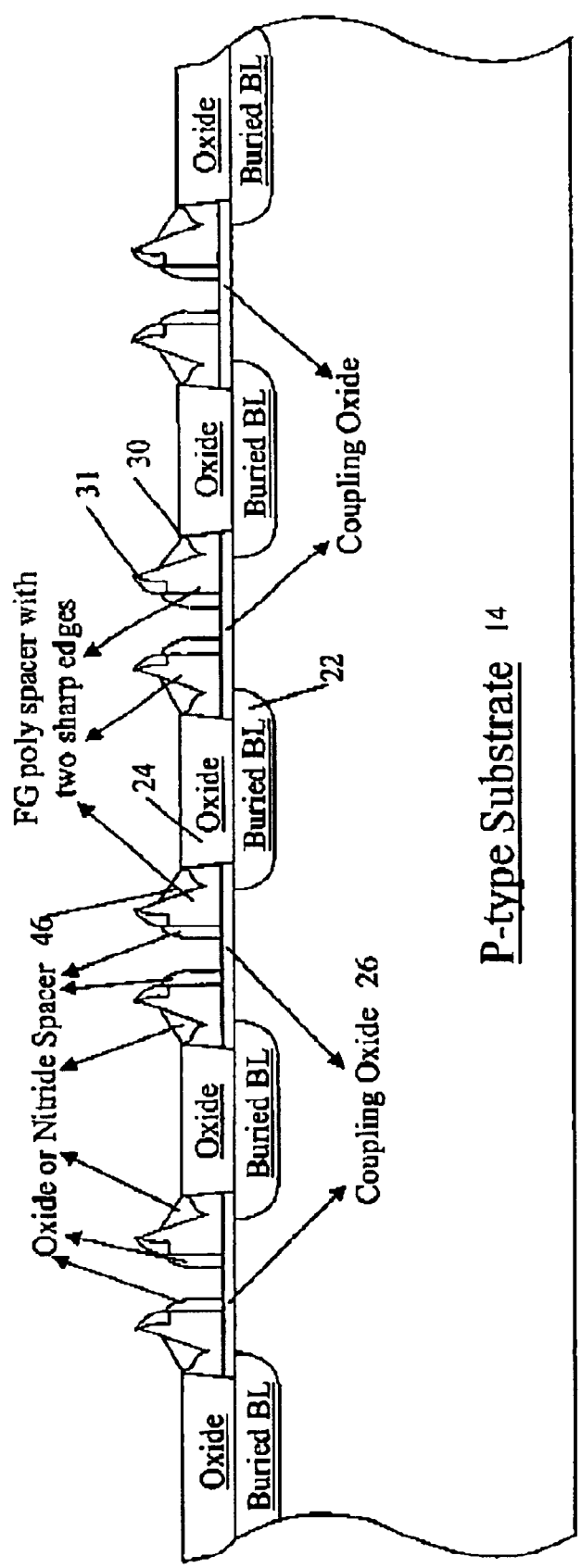

From the structure shown in FIG. 11, the memory array is then processed by the process steps shown and described for FIGS. 5, 6 and 7. A top view of the resultant structure is the same as that shown in FIG. 7.

Memory Cell Operation

Figure 12:
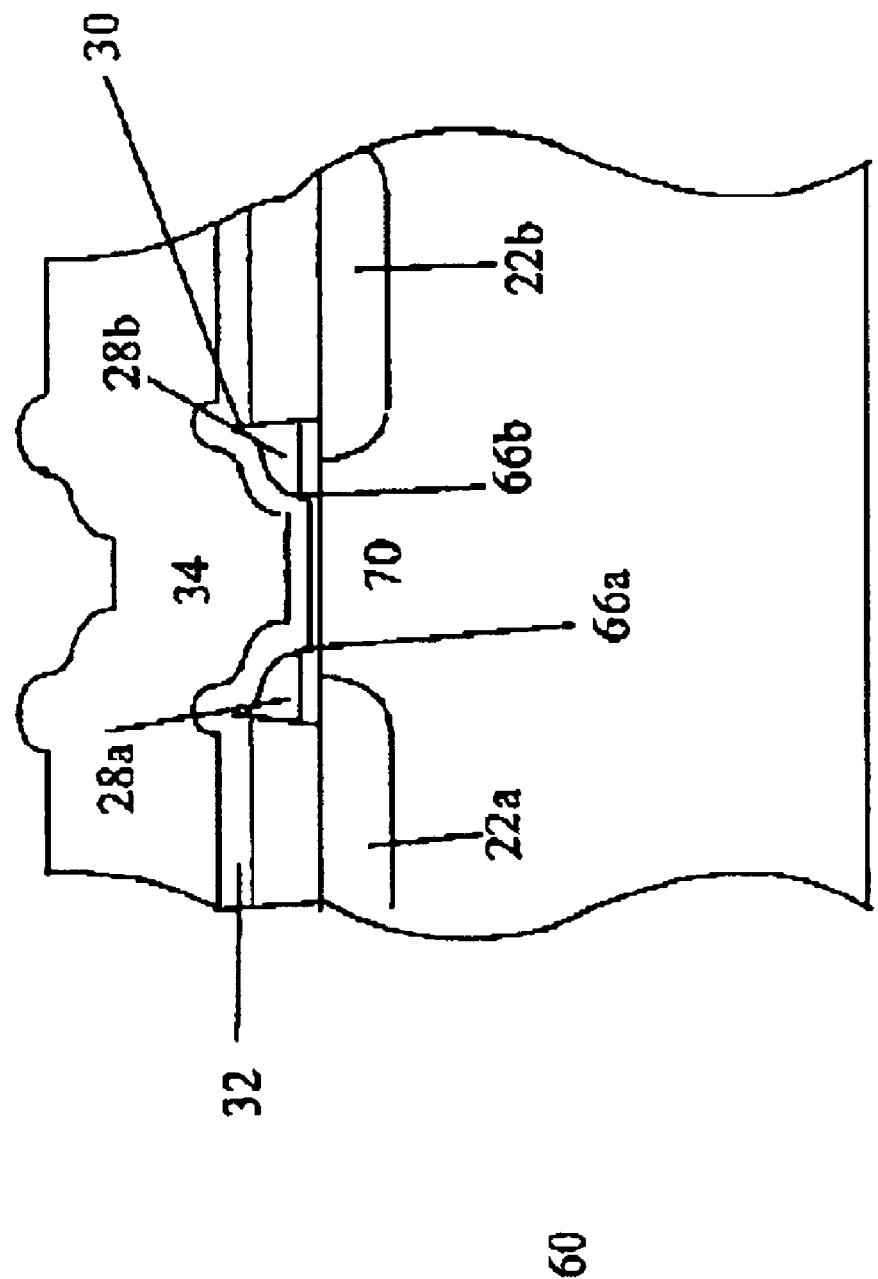
FIG. 12 is cross sectional view of a memory cell of the present invention, which is a portion of the structure shown in FIG. 6.

The operation of the memory cell 60 shown in FIG. 12 will now be described.

Erase

The memory cell 60 is erased by applying 0 volts to the source/drain 22(a,b), and a high voltage, such as +12 volts to the control gate 34. Since the same voltage is applied to both source/drain regions 22(a,b), no charges will conduct in the channel region 70. Furthermore, because the control gate 34 is capacitively coupled to the floating gates 28(a,b), a portion of the high voltage applied to the control gate 34 is across the control gate 34 and the floating gates 28(a,b), and, thus, electrons from the floating gates 28(a,b) will be pulled by the positive voltage applied to the control gate 34, and through the mechanism of Fowler-Nordheim tunneling, the electrons are removed from the floating gates 28(a,b), and tunnel from the tips 30 through the tunneling oxide layer 32 onto the control gate 34. This mechanism of poly-to-poly tunneling for erase is set forth in U.S. Pat. 5,029,130, whose disclosure is incorporated herein in its entirety by reference.

Programming

Programming of the memory cell 60 can occur in one of two mechanisms: either the first floating gate 28a is programmed or the second floating gate 28b is programmed. Let us first discuss the action of programming the first floating gate 28a, i.e. storage of electrons on the first floating gate 28a. The first source region 22a is held at a positive voltage of between 10 to 15 volts. The control gate 34 is held at a positive voltage of between 1.5 to 3 volts. The second source region 22b is held at 0 volts. Because the control gate 34 is capacitively coupled to the second floating gate 28b, the positive voltage of 1.5–3 volts on the control gate 34 is sufficient to turn on the third portion of the channel region 70, i.e. the portion adjacent to the second source/drain region 22b, over which the second floating gate 28b lies, even if the second floating gate 28b is programmed, i.e. has electrons stored thereon. The positive voltage of 1.5–3 volts on the control gate 34 is sufficient to turn on the second portion of the channel region 70, i.e. the portion of the channel region 70 between the first portion and the third portion. The positive voltage of 7–15 volts on the first source region 22a is sufficient to attract the electrons in the channel region 70. Thus, electrons will traverse in the channel region 70 from the second source region 22b to the first source region 22a. However, at the junction in the channel region 70 where the channel region 70 is close to the tip 66a of the first floating gate 28a, the electrons will experience a sudden increase in energy, caused by the high electrical field generated by the positive high voltage of the first source region 22a. This causes the electrons to be source-side injected onto the first floating gate 28a. Unlike the channel hot electron (CHE) injection which requires a high channel current on the order of a few hundreds of uA for programming, the source-side hot electron (SHE) injection only requires a very low channel current on the order of 1 uA. Therefore, only a low control gate voltage (1.5–3 V) is necessary for programming. This mechanism of source-side hot electron injection for programming is set forth in U.S. Pat. No. 5,029,130, whose disclosure is incorporated herein in its entirety by reference.

To program the second floating gate 28b, the voltages applied to the first source region 22a are reversed from those applied to the second source region 22b.

Read

Reading of the memory cell 60 can occur in one of two mechanisms: either the state of the first floating gate 28a is read, or the state of the second floating gate 28b is read. Let us first discuss the action of reading the state of the second floating gate 28b, whether electrons are stored on the second floating gate 28b. The first source/drain region 22a is held at a positive voltage of between 1 to 3.5 volts. This is sufficient to create a depletion region that extends beyond the first portion of the channel region 70. The control gate 34 is held at a positive voltage of between 1 to 3 volts. The second source/drain region 22b is held at 0 volts. The positive voltage of 1–3 volts on the control gate 34 is sufficient to turn on the second portion of the channel region 70. Electrons will traverse in the channel region 70 from the second source/drain region 22b to the first source/drain region 22a, depending on whether the second floating gate 28b is programmed or not. If the second floating gate 28b is programmed, the third portion of the channel region 70 over which the second floating gate 28 lies will not be turned on. In that event no electron flow would occur. If, however, the second floating gate 28b is erased, then electrons will flow from the second source/drain region 22b, through the third portion of the channel region 70, through the second portion of the channel region 70 (because the control gate 34 has turned it on) and to the outer limit of the depletion region caused by the positive voltage applied to the first source/drain region 22a. Thus, the amount of current or the presence/absence of current sensed at the first source region 22a determines the state of programming of the second floating gate 28b.

To read the first floating gate 28a, the voltages applied to the first source/drain region 22a are reversed from those applied to the second source/drain region 22b.

Memory Cell Array Operation

Figure 13:
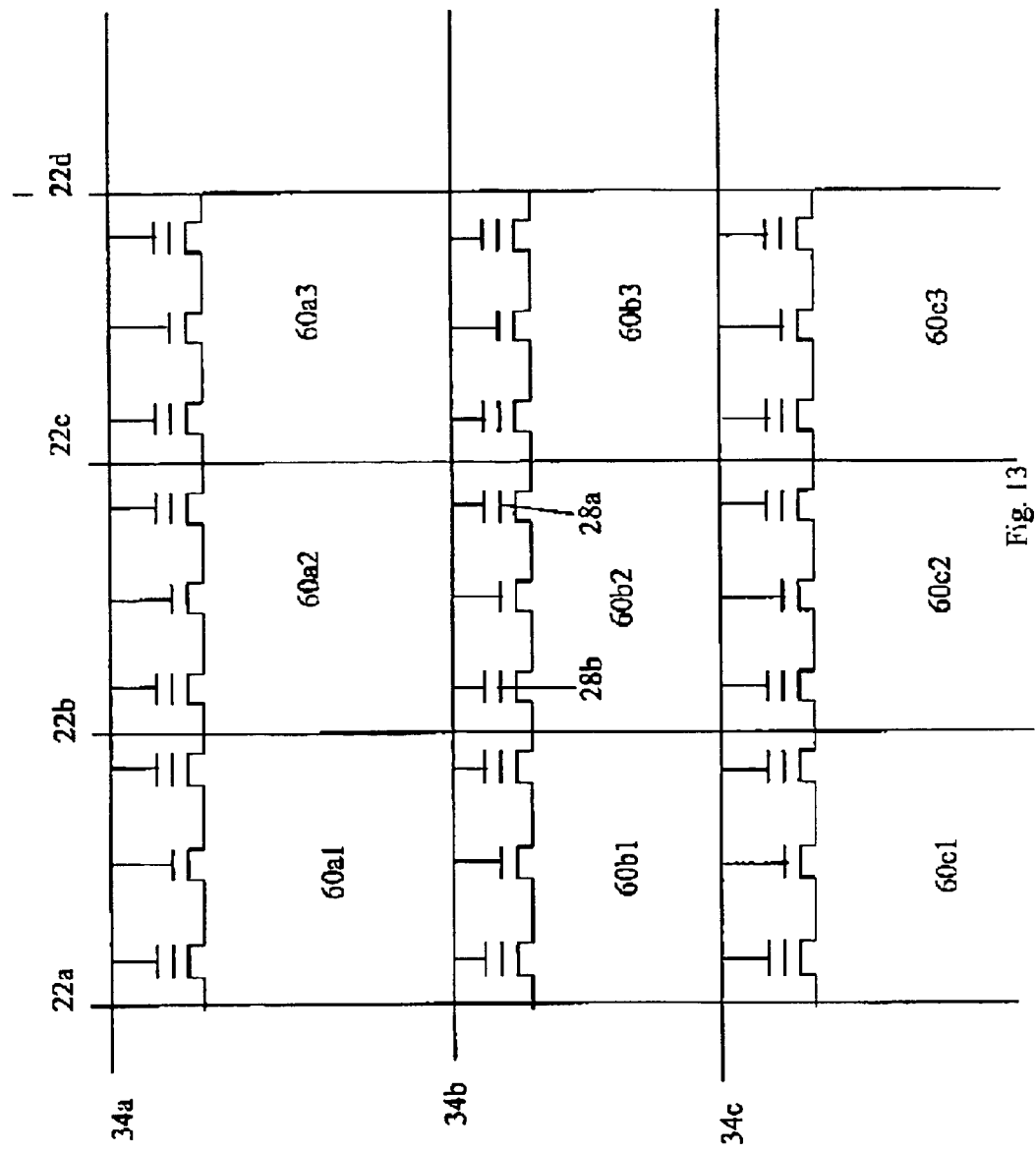
FIG. 13 is schematic diagram of a memory array of the present invention.

The operation of an array of memory cells 60 will now be described. Schematically, an array of memory cells is shown in FIG. 13. As shown in FIG. 13, an array of memory cells 60 comprises a plurality of memory cells 60 arranged in a plurality of rows: 60a(1–k), 60b(1–k), and 60c(1–k) and in columns: 60(a–n)1, 60(a–n)2 and 60(a–n)3. The control gate 34 connected to a memory cell 60 is also connected to other memory cells 60 in the same row. The first and second source/drain regions 22 connected to a memory cell 60 are also connected to other memory cells 60 in the same column.

Erase

In the erase operation, memory cells 60 in the same row connected by the common control gate line 34 are erased simultaneously. Thus, for example, if it is desired to erase memory cells 60 in the row 60b(1–n), the control gate line 34b is held at between 8 to 12 volts. The unselected control gate lines 34a and 34c are held at 0 volts. All the source/drain region lines 22a, 22b, and 22c are held at 0 volts. In this manner all of the memory cells 60b(1–n) are erased simultaneously, while no erase disturbance occurs with respect to the memory cells 60 in the other rows because all terminals to the memory cells 60 in all the other rows are at ground voltage. If it is desired, a group of control gate lines 34 or the whole memory array can also be erased simultaneously.

Program

Let us assume that the second floating gate 28b of the memory cell 60b2 is to be programmed. Then based upon the foregoing discussion, the voltages applied to the various lines are as follows: control gate line 34b is at a positive voltage of between 1.5 to 3 volts. All the other unselected control gate lines 34 are held at 0 volts. Source/drain line 22b is held at 0 volts. All the unselected source/drain line 22 that are adjacent to the source/drain line 22b (on the side opposite source/drain 22b), such as source/drain line 22a, are held at 0 volts. Selected source/drain line 22c is held at a positive voltage of between 7 to 15 volts. All unselected source/drain lines 22 adjacent to the source/drain line 22b (on the side opposite source/drain 22a), such as source/drain line 22d, are held at a voltage of between 3 to 7 volts. The "disturbance" on the unselected memory cells 15 are as follows:

For the memory cells 60 in the unselected row, the application of 0 volts to control gate 34 means that none of the channel regions 70 for those memory cells 60c(1–n) and 60a(1–n) are turned on, because the second portion of the channel region (the portion to which the control gate 34 directly controls) are not turned on. Thus, there is no disturbance. For the memory cell 60b1 which is in the same selected row, but in an unselected column, the application of 0 volts to the source/drain lines 22a and 22b means that the channel region 70 is not turned on. For the memory cell 60b3 which is in the same selected row, but in an unselected column, the application of 3–4 volts to source/drain line 22d, which is greater than the voltage applied to the control gate 34b means that the channel region 70 will not be turned on. Similarly for all other memory cells 60 in the selected row but unselected column, the channel region 70 of those memory cells 60 will not be turned on, due to the voltage to the source/drain lines to that memory cell 60 being at the same voltage.

To program the first floating gate 28a, the voltages applied to the source/drain lines 22b and 22c are reversed. In addition, the other unselected column lines will have the following voltages applied: for all the unselected source/drain lines on the same side as the source/drain line 22c, such as source/drain line 22d, 0 volts is applied; for all the unselected source/drain lines on the same side as the source/drain line 22b, such as source/drain line 22a, 3–7 volts is applied.

Read

Let us assume that the second floating gate 28b of the memory cell 60b2 is to be read. Then based upon the foregoing discussion, the voltages applied to the various lines are as follows: The source/drain line 22b is held at a positive voltage of between 1 to 3.5 volts. The control gate line 34b is held at a positive voltage between 1 to 3 volts. The source/drain line 22c is held at 0 volts.

The voltages applied to the unselected control gate lines 34 are at ground or 0 volts. The voltage on the unselected source/drain lines 22 to the same side as the source/drain line 22b, such as source/drain line 22a, is also at 1 to 3.5 volts. The voltage on the unselected source/drain lines 22 to the same side as the source/drain line 22c, such as source/drain line 22d, is at 0 volts. The "disturbance" on the unselected memory cells 60 is as follows:

For the memory cells 60 in the unselected rows, the application of 0 volts to control gate lines 34 means that none of the channel regions 70 for those memory cells 60c(1–k) and 60a(1–k) is turned on. Thus, there is no disturbance. For the memory cell 60b3 which is in the same selected row, but in an unselected column, the application of 0 volts to line 22d, the same voltage as applied to source/drain 22c means that the channel region 70 of the memory cell 60b3 is not turned on. Thus, little or no disturbance to memory cell 60b3 would occur. Similarly, for the memory cells 60 in the same selected cow but unselected column to the other side of the source/drain 22b, there will not be any disturbance because the channel region 70 also will not be turned on, because the same voltage is applied to both of the source/drain lines 22 to each of the unselected memory cells 60, e.g. memory cell 60b1.

To read the first floating gate 28a, the voltages applied to the source/drain region line 22a are reversed from those applied to the source/drain region line 22b. In addition, the voltage applied to the source/drain region 22 of all the lines to the same side as the source/drain line 22b is reversed from that applied to the voltage applied to the same side as the source/drain lines 22c.

From the foregoing it can be seen that a novel, high density non-volatile memory cell, array and method of manufacturing is disclosed. It should be appreciated that although the preferred embodiment has been described in which a single bit is stored in each of the two floating gates in a memory cell, it is also within the spirit of the present invention to store multi-bits on each one of the floating gates in a single memory cell, thereby increasing further the density of storage.

What is claimed is:

1. A non-volatile memory cell comprising:

a substantially single crystalline semiconductive material of a first conductivity type;

a first region of a second conductivity type, different from said first conductivity type in said material;

a second region of said second conductivity type in said material, spaced apart from said first region;

a channel region, having a first portion, a second portion, and a third portion, connecting said first and second regions for the conduction of charges;

a first dielectric adjacent to said channel region;

a second dielectric adjacent to said first region;

a third dielectric adjacent to said second region;

a first floating gate adjacent to said first dielectric spaced apart from said first portion of said channel region, formed as a spacer, contiguous with and immediately adjacent to said second dielectric;

a second floating gate adjacent to said first dielectric, spaced apart from said third portion of said channel region, formed as a spacer, contiguous with and immediately adjacent to said third dielectric; and a gate electrode capacitively coupled to said first floating gate, and said second floating gate, and spaced apart from said second portion of said channel region, said second portion of said channel region between said first portion and said third portion.

2. The cell of claim 1 wherein said substantially single crystalline semiconductive material is single crystalline silicon.

3. The cell of claim 2, wherein each of said first floating gate and second floating gate is made of polysilicon.

4. The cell of claim 3 wherein each of said first floating gate and second floating gate has a tip directed to said gate electrode.

5. The cell of claim 4 wherein said first dielectric permits hot electrons to be injected from the channel region onto the first floating gate.

6. The cell of claim 5 wherein said first dielectric permits hot electrons to be injected from the channel region onto the second floating gate.

7. The cell of claim 6 further comprising a fourth dielectric between said gate electrode and said first floating gate, said second floating gate, and said second portion of said channel region.

8. The cell of claim 7 wherein said fourth dielectric permits Fowler-Nordheim tunneling of charges therethrough from said first floating gate to said gate electrode, and from said second floating gate to said gate electrode.

9. The cell of claim 1 wherein each of said second dielectric and said third dielectric has a negative slope.

10. An array of non-volatile memory cells, arranged in a plurality of rows and columns, said array comprising:

a substantially single crystalline semiconductive substrate material of a first conductivity type;

a plurality of non-volatile memory cells arranged in a plurality of rows and columns in said semiconductive substrate material with each cell for storing a plurality of bits, and with each cell comprising:

a first region of a second conductivity type, different from said first conductivity type in said material;

a second region of said second conductivity type in said material, spaced apart from said first region;

a channel region, having a first portion, a second portion and a third portion, connecting said first and second regions for the conduction of charges;

a first dielectric adjacent to said channel region;

a second dielectric adjacent to said first region;

a third dielectric adjacent to said second region;

a first floating gate of polysilicon adjacent to said first dielectric spaced apart from said first portion of said channel region, formed as a spacer, contiguous with and immediately adjacent to said second dielectric;

a second floating gate of polysilicon adjacent to said first dielectric, spaced apart from said third portion of said channel region, formed as a spacer, contiguous with and immediately adjacent to said third dielectric; and a gate electrode capacitively coupled to said first floating gate, and said second floating gate, and spaced apart from said second portion of said channel region, said second portion of said channel region between said first portion and said third portion.

wherein said cells in the same row have said gate electrode in common;

wherein said cells in the same column have said first region in common, said second region in common, said second dielectric in common, and said third dielectric in common; and wherein said cells in adjacent columns have said first region in common.

11. The array of claim 10 wherein said substantially single crystalline semiconductive material is single crystalline silicon.

12. The array of claim 11 wherein said gate electrode is substantially parallel to said channel region.

13. The array of claim 12, wherein each of said first floating gate and second floating gate is made of polysilicon.

14. The array of claim 13 wherein each of said first floating gate and second floating gate has a tip directed to said gate electrode.

15. The array of claim 14 wherein said first dielectric permits hot electrons to be injected from the channel region onto the first floating gate.

16. The array of claim 15 wherein said first dielectric permits hot electrons to be injected from the channel region onto the second floating gate.

17. The array of claim 16 further comprising a fourth dielectric between said gate electrode and said first floating gate, said second floating gate, and said second portion of said channel region.

18. The array of claim 17 wherein said fourth dielectric permits Fowler-Nordheim tunneling of charges therethrough from said first floating gate to said gate electrode, and from said second floating gate to said gate electrode.

19. The array of claim 12, wherein each of said second dielectric and said third dielectric has a negative slope.

20. A method of manufacturing a non-volatile memory cell in a substantially single crystalline semiconductive material of a first conductivity type, wherein said method comprising:

forming a first region and a second region in said material, with said first region and said second region being of a second conductivity type, different from said first conductivity type, with a channel region for the conduction of charges connecting said first region and said second region; said channel region, having a first portion, a second portion and a third portion, with said second portion between said first portion and said third portion, with said first portion of said channel region adjacent to said first region and said third portion of said channel region adjacent to said second region;

forming a first dielectric adjacent to said channel region;

forming a second dielectric adjacent to said first region;

forming a third dielectric adjacent to said second region;

forming a first floating gate spacer contiguous with and immediately adjacent to said second dielectric, said first floating gate adjacent to said first dielectric and spaced apart from said first portion of said channel region;

forming a second floating gate spacer contiguous with and immediately adjacent to said third dielectric, said second floating gate adjacent to said first dielectric and spaced apart from said third portion of said channel region; and forming a gate electrode, capacitively coupled to said first floating gate and said second floating gate, and spaced apart from said second portion of said channel region.

21. The method of claim 20 wherein said substantially single crystalline semiconductive material is single crystalline silicon.

22. The method of claim 21 wherein each of said first floating gate and said second floating gate comprises polysilicon.

23. The method of claim 22 wherein each of said first floating gate and said second floating gate has a tip directed to said gate electrode.

24. The method of claim 23 wherein said first dielectric permits hot electrons to be injected from the channel region onto the first floating gate.

25. The method of claim 24 wherein said first dielectric permits hot electrons to be injected from the channel region onto the second floating gate.

26. The method of claim 25 further comprising a fourth dielectric between said gate electrode and said first floating gate, said second floating gate, and said second portion of said channel region.

27. The method of claim 26 wherein said fourth dielectric permits Fowler-Nordheim tunneling of electrons from said first floating gate and said second floating gate to said gate electrode.

28. The method of claim 20 wherein each of said second dielectric and said third dielectric has a negative slope.

29. A method of manufacturing an array of non-volatile memory cells in a substantially single crystalline semiconductive material of a first conductivity type, wherein said array of non-volatile memory cells has a plurality of non-volatile memory cells arranged in a plurality of rows and columns in said semiconductive substrate material, said method comprising:

forming spaced apart first and second regions in said semiconductive substrate that are substantially parallel to one another and extend in a column direction, each of said first and second regions being of a second conductivity type, different from said first conductivity type, with a channel region therebetween for the conduction of charges connecting said first region and said second region; said channel region, having a first portion, a second portion and a third portion, with said first portion of said channel region adjacent to said first region and said third portion of said channel region adjacent to said second region, and with said second portion of the channel region between said first portion and said third portion;

forming a first dielectric adjacent to said first region, said first dielectric extending in said column direction;

forming a second dielectric adjacent to said second region, said second dielectric extending in said column direction;

forming a third dielectric adjacent to said channel region;

forming a first floating gate spacer, extending in said column direction, contiguous with and immediately adjacent to said first dielectric, adjacent to said third dielectric and spaced apart from said first portion of said channel region;

forming a second floating gate spacer, extending in said column direction, contiguous with and immediately adjacent to said second dielectric, adjacent to said third dielectric and spaced apart from said third portion of said channel region;

forming a plurality of spaced apart gate electrodes, each in a row direction, capacitively coupled to said first floating gate, said second floating gate, and spaced apart from said second portion of said channel region; and forming isolation regions between adjacent rows of gate electrodes.

30. The method of claim 29 wherein each of said first floating gate and second floating gate has a tip directed to said gate electrode.

31. The method of claim 30 wherein said third dielectric permits hot electrons to be injected from the channel region onto the first floating gate.

32. The method of claim 31 wherein said third dielectric permits hot electrons to be injected from the channel region onto the second floating gate.

33. The method of claim 32 further comprising a fourth dielectric between said gate electrode and said first and second floating gates.

34. The method of claim 33 wherein said fourth dielectric permits Fowler-Nordheim tunneling of charges therethrough from said first floating gate to said gate electrode, and from said second floating gate to said gate electrode.

35. The method of claim 29 wherein each of said first dielectric and said second dielectric has a negative slope.

36. The method of claim 29 wherein said forming isolation regions step further comprises:

removing said first and second floating gate spacers between adjacent rows of gate electrodes.

37. The method of claim 36 further comprising: doping said isolation regions to form a heavily doped region of said first conductivity type.

* * * * *